(12) United States Patent
Hashimoto et al.

(10) Patent No.: US 9,166,557 B2
(45) Date of Patent: Oct. 20, 2015

(54) PIEZOELECTRIC THIN FILM RESONATOR AND FILTER

(71) Applicant: TAIYO YUDEN CO., LTD., Tokyo (JP)

(72) Inventors: Kenya Hashimoto, Chiba (JP); Jiansong Liu, Chiba (JP); Masanori Ueda, Tokyo (JP); Shinji Taniguchi, Tokyo (JP); Tokihiro Nishihara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 19 days.

(21) Appl. No.: 14/136,363

(22) Filed: Dec. 20, 2013

(65) Prior Publication Data

US 2014/0191826 A1    Jul. 10, 2014

(30) Foreign Application Priority Data

Jan. 8, 2013 (JP) .................... 2013-001376

(51) Int. Cl.
*H03H 9/00* (2006.01)
*H01L 41/04* (2006.01)
*H03H 9/56* (2006.01)
*H03H 9/58* (2006.01)
*H03H 9/02* (2006.01)
*H03H 9/17* (2006.01)
*H03H 9/64* (2006.01)

(52) U.S. Cl.
CPC ............... *H03H 9/564* (2013.01); *H03H 9/582* (2013.01); *H03H 9/02086* (2013.01); *H03H 9/173* (2013.01); *H03H 9/174* (2013.01); *H03H 9/175* (2013.01); *H03H 9/6496* (2013.01)

(58) Field of Classification Search
CPC ........ H03H 9/13; H01L 41/047; H01L 41/08; H01L 41/29
USPC .................... 333/195, 187–192; 310/320–322
See application file for complete search history.

(56) References Cited

U.S. PATENT DOCUMENTS

| | | | |
|---|---|---|---|
| 7,737,806 B2 * | 6/2010 | Taniguchi et al. | 333/187 |
| 8,531,087 B2 * | 9/2013 | Yokoyama et al. | 310/329 |
| 8,854,158 B2 * | 10/2014 | Yokoyama et al. | 333/189 |
| 2008/0169885 A1 * | 7/2008 | Ueda et al. | 333/187 |
| 2012/0200373 A1 | 8/2012 | Taniguchi et al. | |

FOREIGN PATENT DOCUMENTS

| | | |
|---|---|---|
| JP | 2011-71913 A | 4/2011 |
| JP | 2012-165268 A | 8/2012 |

* cited by examiner

*Primary Examiner* — Dinh Le
(74) *Attorney, Agent, or Firm* — Chen Yoshimura LLP

(57) ABSTRACT

A piezoelectric thin film resonator includes: a substrate; a piezoelectric film located on the substrate; a lower electrode and an upper electrode located to sandwich the piezoelectric film; a load film formed from patterns in a resonance region in which the lower electrode and the upper electrode face each other across the piezoelectric film, wherein the patterns are formed so as to surround a center of the resonance region and intersect with a pathway extending from the center to an outer periphery of the resonance region.

10 Claims, 10 Drawing Sheets

PIEZOELECTRIC THIN FILM RESONATOR AND FILTER

CROSS-REFERENCE TO RELATED APPLICATION

This application is based upon and claims the benefit of priority of the prior Japanese Patent Application No. 2013-001376, filed on Jan. 8, 2013, the entire contents of which are incorporated herein by reference.

FIELD

A certain aspect of the present invention relates to a piezoelectric thin film resonator and a filter.

BACKGROUND

Acoustic wave devices using a piezoelectric thin film resonator have been used as filters in wireless devices, for example. The piezoelectric thin film resonator has a structure designed to have a lower electrode and an upper electrode facing each other across a piezoelectric film. A resonance region is a region in which the lower electrode and the upper electrode face each other across the piezoelectric film. Japanese Patent Application Publication Nos. 2012-165288 and 2011-71913 disclose forming a load film in a part in the resonance region.

Spurious may occur at frequencies lower or higher than the resonance frequency in the piezoelectric thin film resonator. For example, when a filter is formed by using a piezoelectric thin film resonator in which spurious occurs, a ripple is formed in the passband.

SUMMARY OF THE INVENTION

According to an aspect of the present invention, there is provided a piezoelectric thin film resonator including: a substrate; a piezoelectric film located on the substrate; a lower electrode and an upper electrode located to sandwich the piezoelectric film; a load film formed from patterns in a resonance region in which the lower electrode and the upper electrode face each other across the piezoelectric film, wherein the patterns are formed so as to surround a center of the resonance region and intersect with a pathway extending from the center to an outer periphery of the resonance region.

According to an aspect of the present invention, there is provided a filter including the above-described piezoelectric thin film resonator.

DETAILED DESCRIPTION

Hereinafter, a description will be given of embodiments of the present invention with reference to the attached drawings.

First Embodiment

Figure 1:
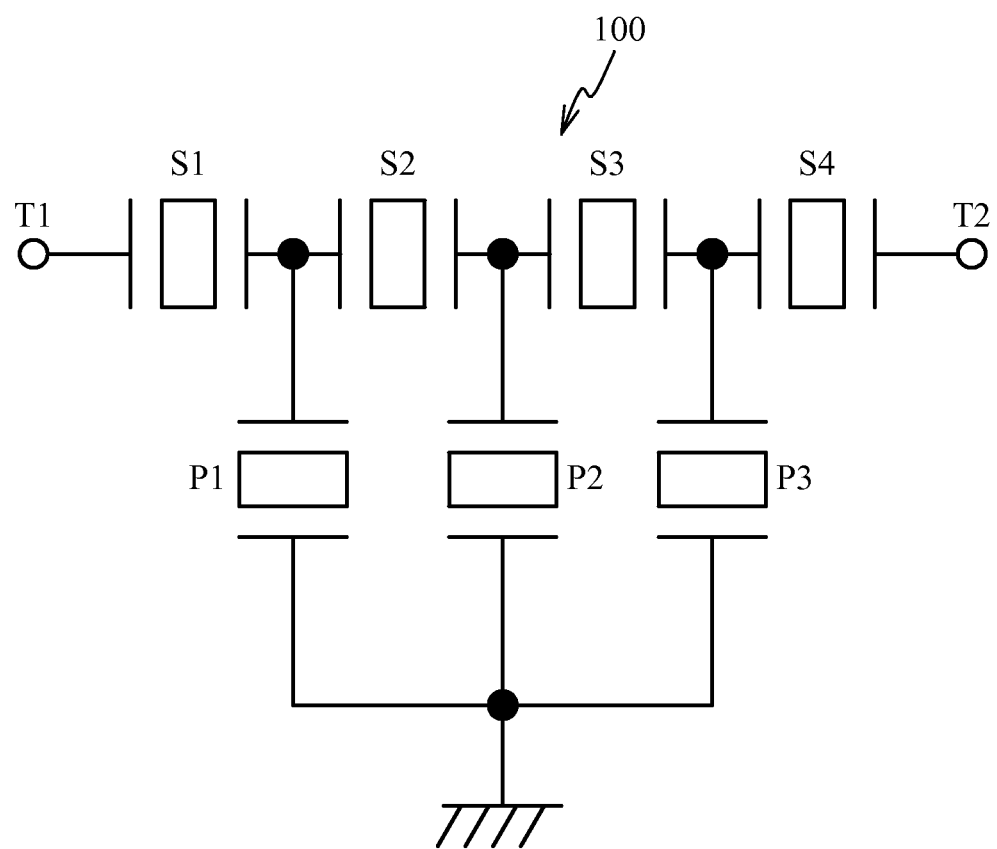
FIG. 1 is a diagram illustrating a ladder-type filter.

A description will first be given of a ladder-type filter as an example that uses an acoustic wave device in accordance with the embodiments. FIG. 1 is a diagram illustrating a ladder-type filter. As illustrated in FIG. 1, a ladder-type filter 100 includes one or more series resonators S1~S4 and one or more parallel resonators P1~P3. The series resonators S1~S4 are connected in series between input-output terminals T1 and T2. The parallel resonators P1~P3 are connected in parallel between the input-output terminals T1 and T2.

Figure 2A:
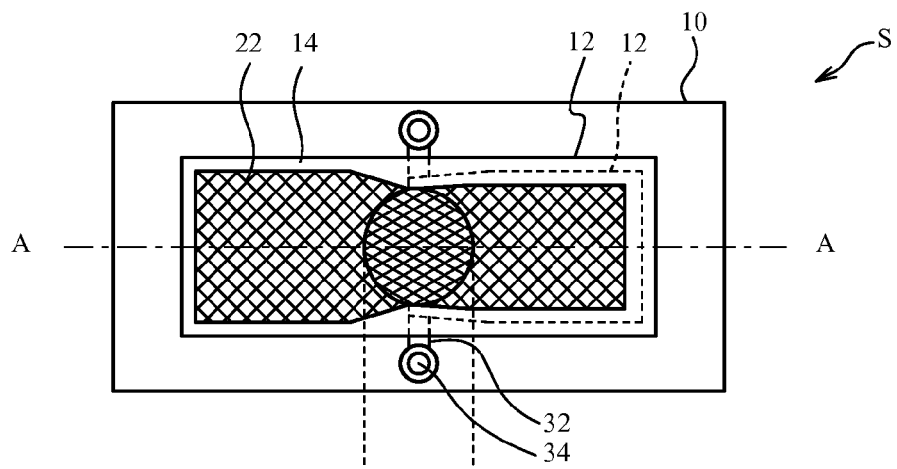
FIG. 2A is a top view of a piezoelectric thin film resonator of a first embodiment.
Figure 2B:
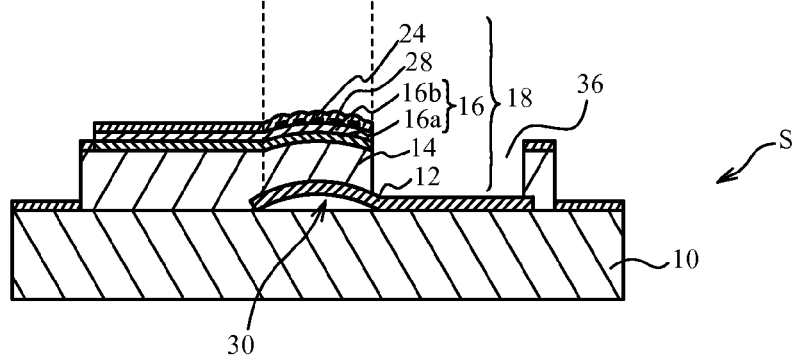
FIG. 2B is a cross-sectional view of a series resonator.
Figure 2C:
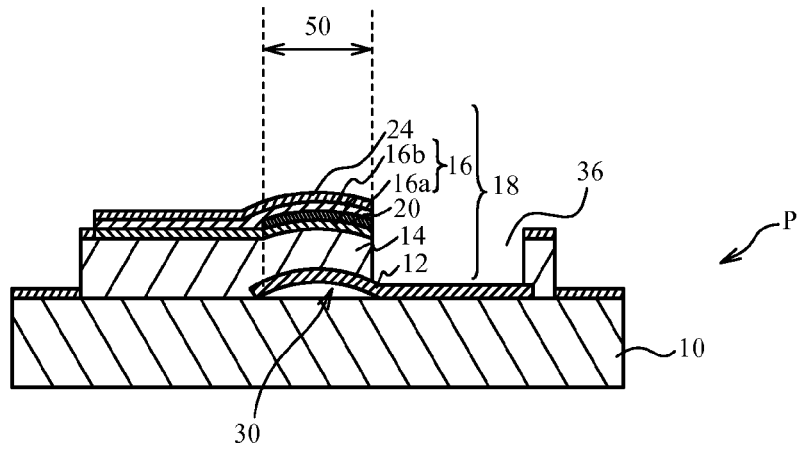
FIG. 2C is a cross-sectional view of a parallel resonator.

FIG. 2A is a top view of a piezoelectric thin film resonator of a first embodiment, FIG. 2B is a cross-sectional view of a series resonator, and FIG. 2C is a cross-sectional view of a parallel resonator. Referring to FIG. 2A and FIG. 2B, a description will be given of a structure of the series resonator S. A lower electrode 12 is formed on a substrate 10. An air-space 30 having a dome-shaped bulge is formed between the flat principal surface of the substrate 10 and the lower electrode 12. The dome-shaped bulge is a bulge having a shape in which the height of the air-space 30 is low near the periphery of the air-space 30 and the height of the air-space 30 increases at closer distances to the center portion of the air-space 30.

A piezoelectric film 14 is located on the lower electrode 12. An upper electrode 16 is located on the piezoelectric film 14. The region in which the lower electrode 12 and the upper electrode 16 face each other across the piezoelectric film 14 is a resonance region 50. The resonance region 50 is a region having an elliptical shape and in which an acoustic wave in a thickness extension (longitudinal oscillation) mode resonates. The lower electrode 12 and the upper electrode 16 face each other across at least a part of the piezoelectric film 14. As illustrated in FIG. 2A to FIG. 2C, the lower electrode 12 and the upper electrode 16 may face each other across a part of the piezoelectric film 14. The upper electrode 16 includes a lower layer 16a and an upper layer 16b. A load film 28 is located on the upper electrode 16.

A frequency adjusting film 24 is located on the upper electrode 16. A multilayered film 18 in the resonance region 50 includes the lower electrode 12, the piezoelectric film 14, the upper electrode 16, the load film 28, and the frequency adjusting film 24. The frequency adjusting film 24 may function as a passivation film.

As illustrated in FIG. 2A, an introduction path 32 to etch a sacrifice layer is formed in the lower electrode 12. The sacrifice layer is a layer for forming the air-space 30. The vicinity of the tip of the introduction path 32 is not covered with the piezoelectric film 14, and the lower electrode 12 has a hole portion 34 at the tip of the introduction path 32. As illustrated in FIG. 2A and FIG. 2B, an aperture 36 that provides electrical connection with the lower electrode 12 is located in the piezoelectric film 14. An underlayer for bumps made of Au for external connection may be located on an extraction wiring of the lower electrode 12 at the bottom of the aperture 36 and/or an extraction wiring of the upper electrode 16.

Referring to FIG. 2A and FIG. 2C, a description will be given of a structure of the parallel resonator P. The parallel resonator P includes a mass load film 20 between the lower layer 16a and the upper layer 16b of the upper electrode 16 in comparison with the series resonator S. The load film 28 is not located. Thus, the multilayered film 18 includes the mass load film 20 formed across the entire surface in the resonance region 50 in addition to the multilayered film of the series resonator S, and does not include the load film 28. Other structures are the same as those of the series resonator S illustrated in FIG. 1B, and thus the description thereof is omitted.

The mass load film 20 and the load film 28 are used to adjust the difference between the resonance frequencies of the series resonator S and the parallel resonator P. The resonance frequencies of the series resonator S and the parallel resonator P are adjusted by adjusting the film thickness of the frequency adjusting film 24.

The substrate 10 may be a silicon substrate, a quartz substrate, a glass substrate, a ceramic substrate, or a GaAs substrate. The lower electrode 12 and the upper electrode 16 may be made of a single-layer film of Ru (ruthenium), Cr (chrome), Al (aluminum), Ti (titanium), Cu (copper), Mo (molybdenum), W (tungsten), Ta (tantalum), Pt (platinum), Rh (rhodium) or Jr (iridium) or a multilayered film of them. The piezoelectric film 14 may be made of aluminum nitride (AlN), ZnO (zinc oxide), PZT (lead zirconate titanate), or PbTiO$_3$ (lead titanate).

The frequency adjusting film 24 may be a silicon oxide film, a silicon nitride film, or an aluminum nitride. The mass load film 20 and the load film 28 may be a single-layer film of Ti, Ru, Cr, Al, Cu, Mo, W, Ta, Pt, Rh or Ir. In addition, the mass load film 20 and the load film 28 may be formed of an insulating film made of metal nitride such as silicon nitride or metal oxide such as silicon oxide. The mass load film 20 and the load film 28 may be formed under the lower electrode 12, between layers of the lower electrode 12, on the upper electrode 16, between layers of the upper electrode 16, between the lower electrode 12 and the piezoelectric film 14, or between the piezoelectric film 14 and the upper electrode 16. The mass load film 20 may be larger than the resonance region 50 as long as it is formed so as to include the resonance region 50. The load film 28 includes two or more patterns in the resonance region 50.

Figure 3A:
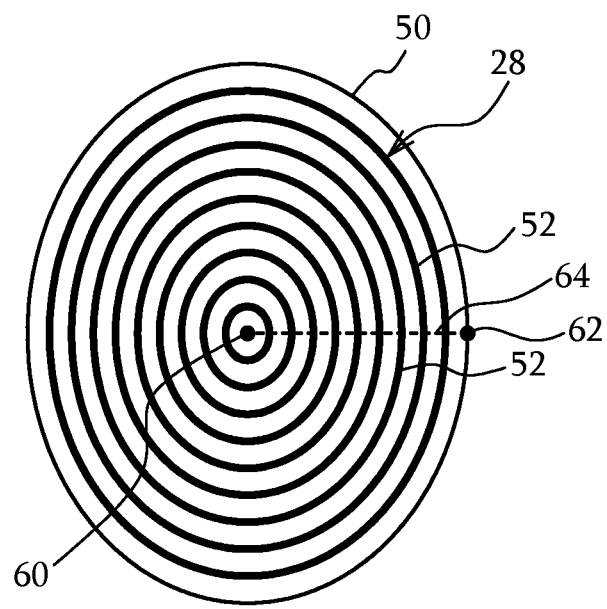
FIG. 3A and FIG. 3B are plan views illustrating examples of a load film.
Figure 3B:
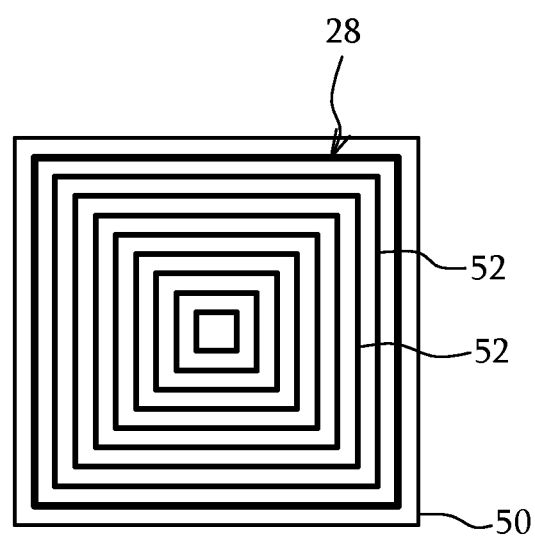

FIG. 3A and FIG. 3B are plan views illustrating examples of the load film. As illustrated in FIG. 3A, the resonance region 50 has an elliptical shape. The load film 28 having patterns 52 is located in the resonance region 50. As illustrated in FIG. 3B, the resonance region 50 has a rectangular shape. The load film 28 having the patterns 52 is located in the resonance region 50. In FIG. 3A and FIG. 3B, the patterns 52 have a homothetic shape to the resonance region 50, and regularly formed to intersect with a pathway 64 extending from a center 60 to an outer periphery 62 of the resonance region 50.

Figure 4:
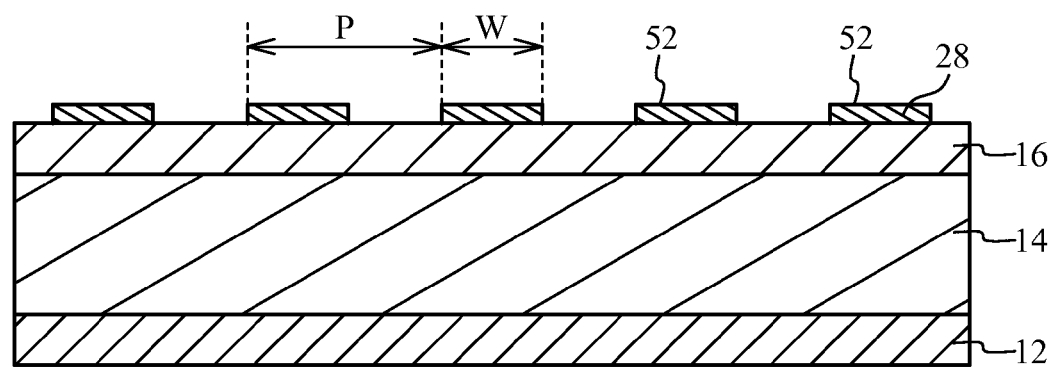
FIG. 4 is a cross-sectional view of a resonance region used in a simulation.

A description will next be given of simulation results. FIG. 4 is a cross-sectional view of a resonance region used in the simulation. The lower electrode 12 and the upper electrode 16 are formed so as to sandwich the piezoelectric film 14. The load film 28 is formed on the upper electrode 16. The load film 28 has the patterns 52. The pattern 52 has a pitch P0 and a width W0.

The simulation was conducted on a one-dimensional line connecting the center and the edge of the resonance region 50. The following presents the material and the film thickness of each film.

Load film 28: Cu 150 nm
Upper electrode 16: Ru 300 nm
Piezoelectric film 14: AlN 1600 nm
Lower electrode 12: Al 300 nm A structure not including the load film 28 was also simulated as a first comparative example.

Figure 5A:
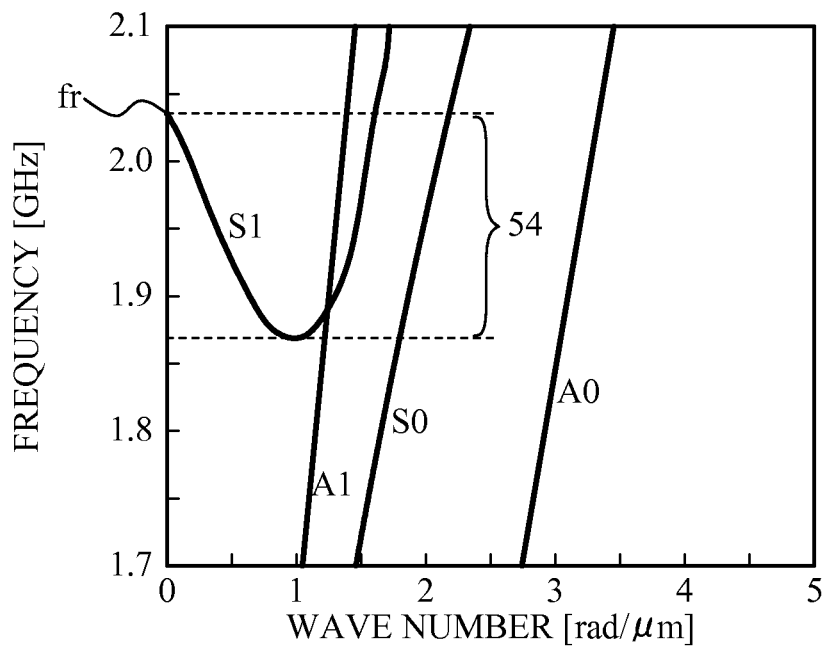
FIG. 5A illustrates dispersion characteristics (simulation results) of a plate wave propagating in a lateral direction of a resonator in a first comparative example and is a diagram illustrating a frequency with respect to a wave number of an X-propagation component.
Figure 5B:
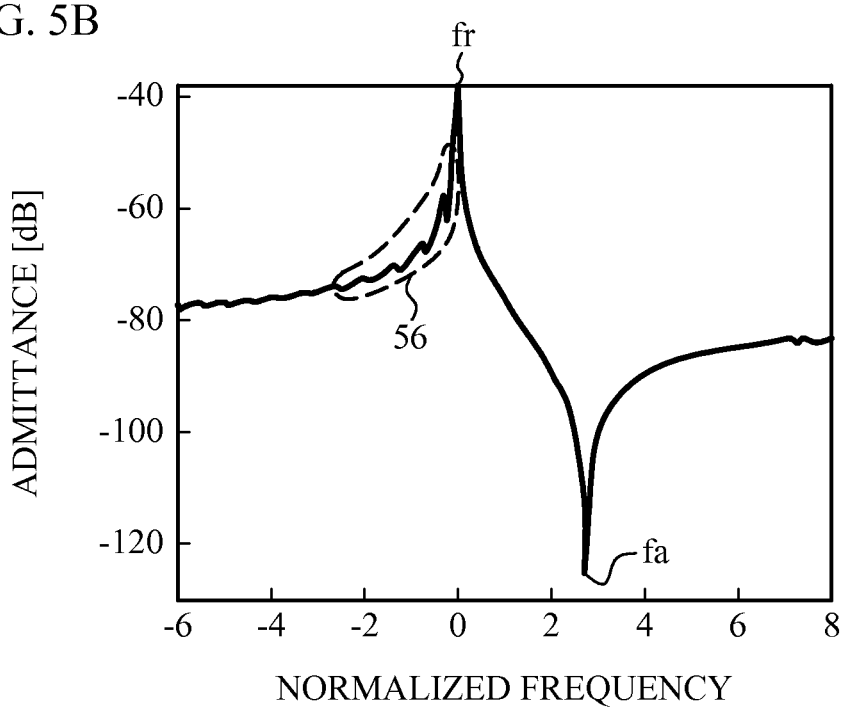
FIG. 5B is a diagram illustrating admittance with respect to a normalized frequency.

FIG. 5A illustrates dispersion characteristics (simulation results) of a plate wave propagating in the lateral direction of the resonator in the first comparative example, and is a diagram illustrating a frequency with respect to a wave number of an X-propagation component, and FIG. 5B is a diagram illustrating admittance with respect to a normalized frequency. In FIG. 5A, the horizontal axis is a wave number in the lateral direction of FIG. 4. Four modes are observed. A mode A0 is a base mode of an asymmetric mode. A mode S0 is a base mode of a symmetric mode. A mode A1 is a first-order mode of an asymmetric mode. A mode S1 is a first-order mode of a symmetric mode, and is a primary mode of the piezoelectric thin film resonator. At a wave number of 0, a response in a thickness extension (longitudinal) mode occurs. When the wave number is greater than 0, the acoustic wave propagates in the lateral direction. The acoustic wave propagated in the lateral direction is reflected at the end of the resonance region 50, and thus spurious easily occurs. A frequency at a wave number of 0 in the mode S1 corresponds to the resonance frequency fr (in this case, approximately 2.03 GHz). In the mode S1, when the wave number becomes greater than 0, the frequency decreases. When the frequency exceeds approximately 1.87 GHz, the frequency increases as the wave number increases. Spurious easily occurs in a region 54 between 1.87 GHz and 2.03 GHz in frequency.

With reference to FIG. 5B, the normalized frequency is calculated by (frequency f-resonance frequency fr)/fr. The resonance frequency fr and the anti-resonance frequency fa are observed. Spurious occurs in a region 56 of which the frequency is lower than the resonance frequency fr. This spurious corresponds to spurious in the region 54 illustrated in FIG. 5A. As described above, in the first comparative example, spurious occurs at frequencies lower than the resonance frequency.

Figure 6A:
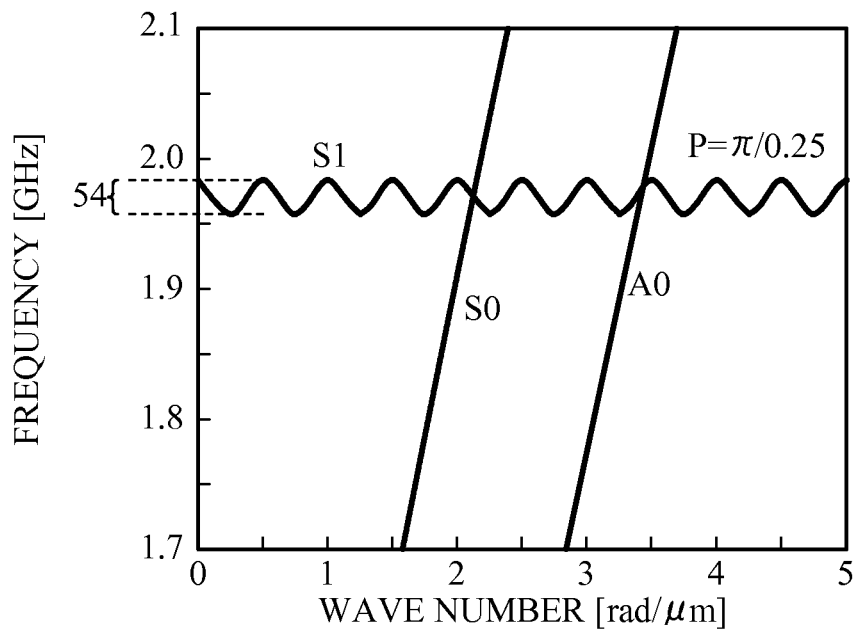
FIG. 6A is a diagram illustrating a frequency with respect to a wave number in the first embodiment.
Figure 6B:
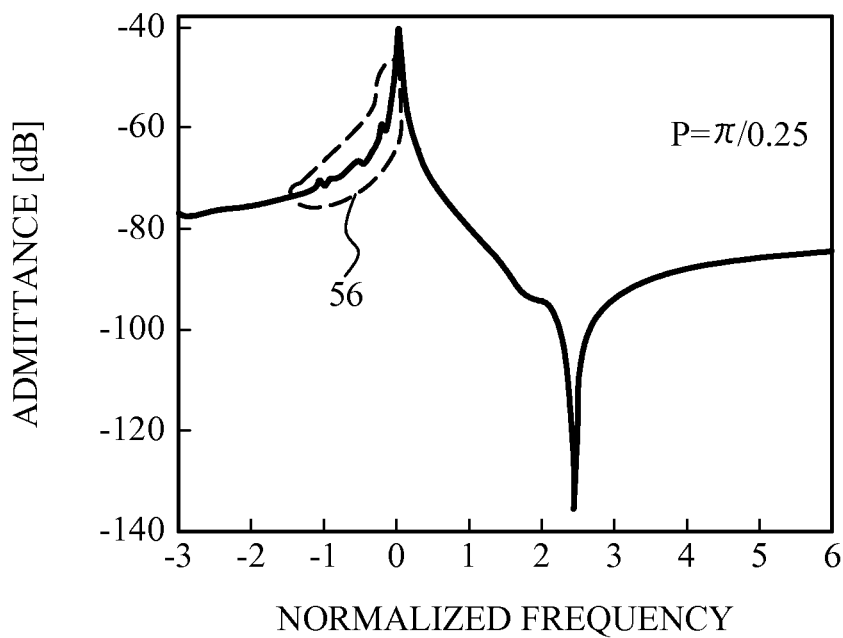
FIG. 6B is a diagram illustrating admittance with respect to a normalized frequency.

FIG. 6A is a diagram illustrating a frequency with respect to a wave number in the first embodiment, and FIG. 6B is a diagram illustrating admittance with respect to a normalized frequency. Simulated samples were configured as pitch P0=π/β wherein β=0.25 rad/μm and W0/P0=0.5. As illustrated in FIG. 6A, the mode S1 waves with a period of 0.5 rad/μm. This narrows the region 54. In the modes other than the mode S1, the effect of the load film 28 is small. As illustrated in FIG. 6B, spurious is small in the region 56 of which the frequency is lower than the resonance frequency fr.

Figure 7A:
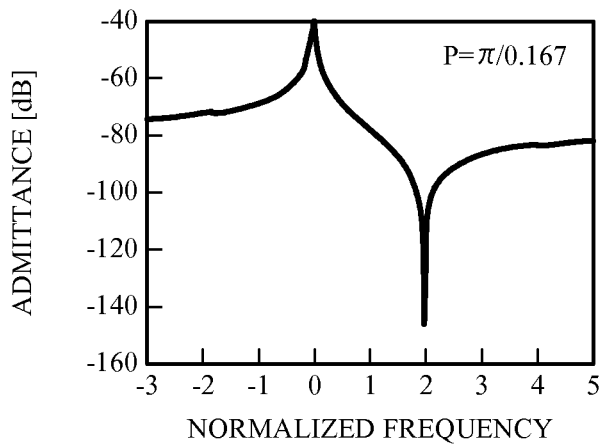
FIG. 7A through FIG. 7C are diagrams illustrating admittance with respect to a normalized frequency in the first embodiment.
Figure 7B:
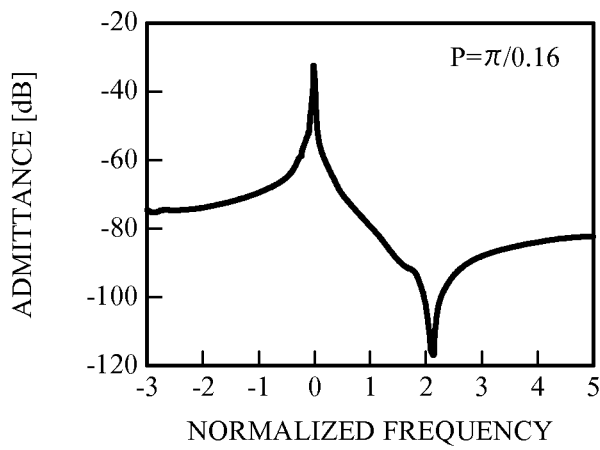
Figure 7C:
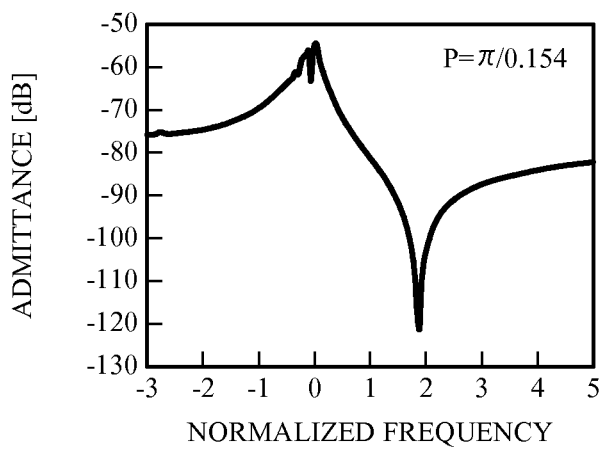

FIG. 7A through FIG. 7C are diagrams illustrating admittance with respect to a normalized frequency in the first embodiment. FIG. 7A through FIG. 7C illustrate simulation results when β is 0.167 rad/μm, 0.16 rad/μm, and 0.154 rad/μm respectively. In all cases, W0/P0=0.5. When β is 0.167 rad/μm and 0.16 rad/μm, spurious is not observed at frequencies lower than the resonance frequency. When β is 0.154 rad/μm, spurious is observed. As described above, spurious is prevented when β is 0.16 rad/μm to 0.25 rad/μm. This corresponds to 2λ to 3.5λ of the pitch P0 wherein λ represents the wavelength of the acoustic wave.

Second Embodiment

Simulation was conducted under the condition same as that of the first embodiment except that the material and the film thickness of each film were configured as follows.
Load film 28:Ru 200 nm
Upper electrode 16:Ru 300 nm
Piezoelectric film 14:AlN 1000 nm
Lower electrode 12:Ru 300 nm
W0/P0=0.5
β=5/9

Figure 8:
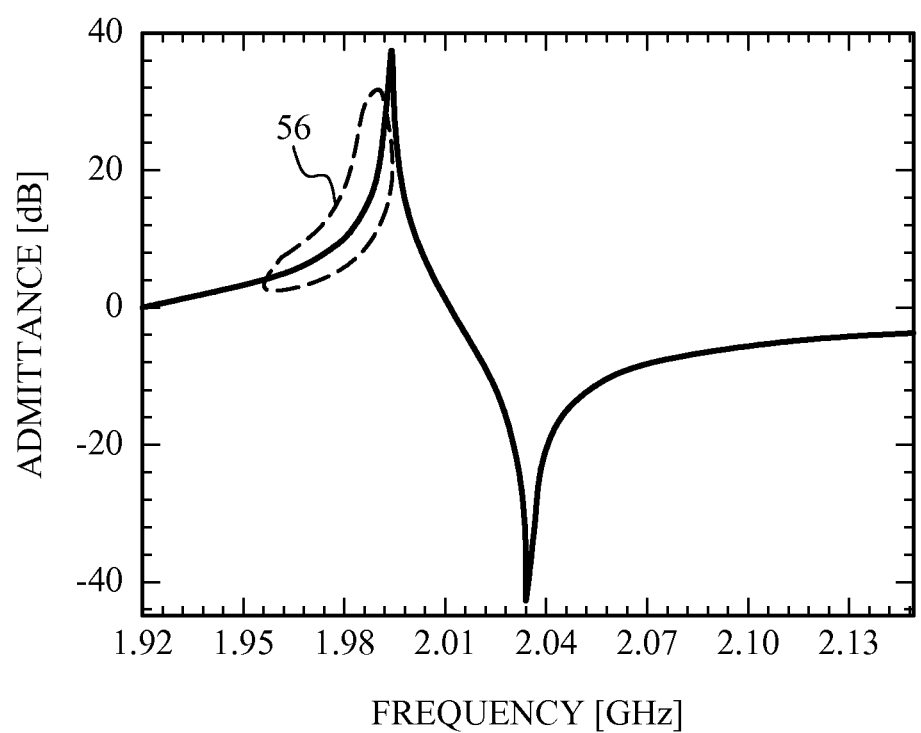
FIG. 8 is a diagram illustrating admittance with respect to a frequency in a second embodiment.

FIG. 8 is a diagram illustrating admittance with respect to a frequency in a second embodiment. As illustrated in FIG. 8, in the second embodiment, spurious is not observed in the region 56 of which the frequency is lower than the resonance frequency.

Third Embodiment

Simulation was conducted under the condition same as that of the first embodiment except that the material and the film thickness of each film were configured as follows. The simulation was also conducted on a second comparative example that has the same structure as that of the third embodiment except that the load film 28 is not located.
Load film 28: Mo 100 nm
Upper electrode 16:Mo 100 nm
Piezoelectric film 14:ZnO 1520 nm
Lower electrode 12:Mo 100 nm
W0/P0=0.5
β=0.25

Figure 9A:
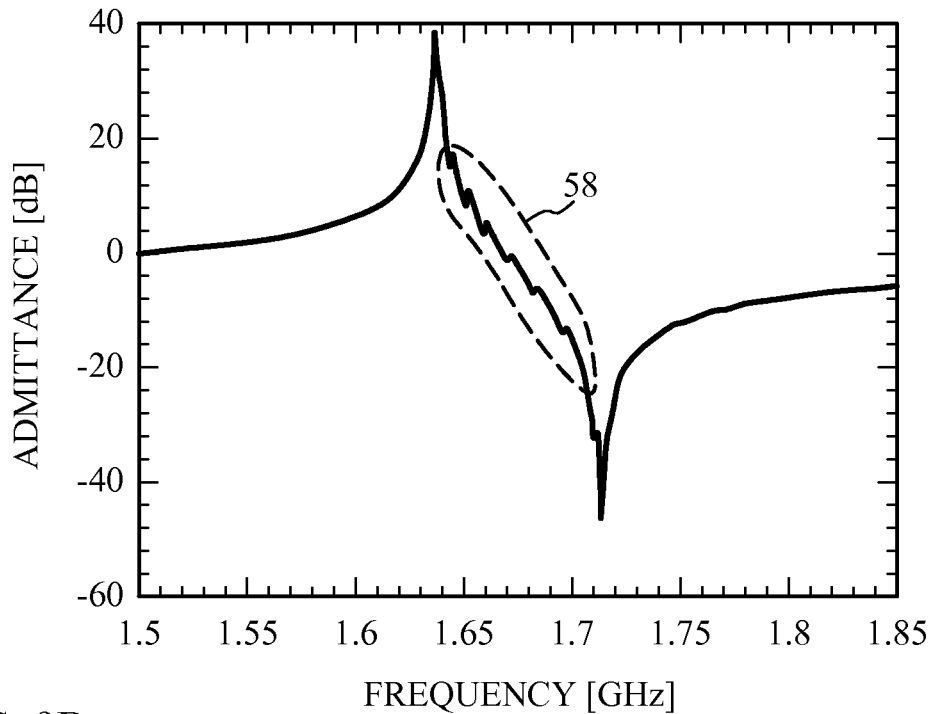
FIG. 9A and FIG. 9B are diagrams illustrating admittance with respect to a frequency in a second comparative example and a third embodiment respectively.
Figure 9B:
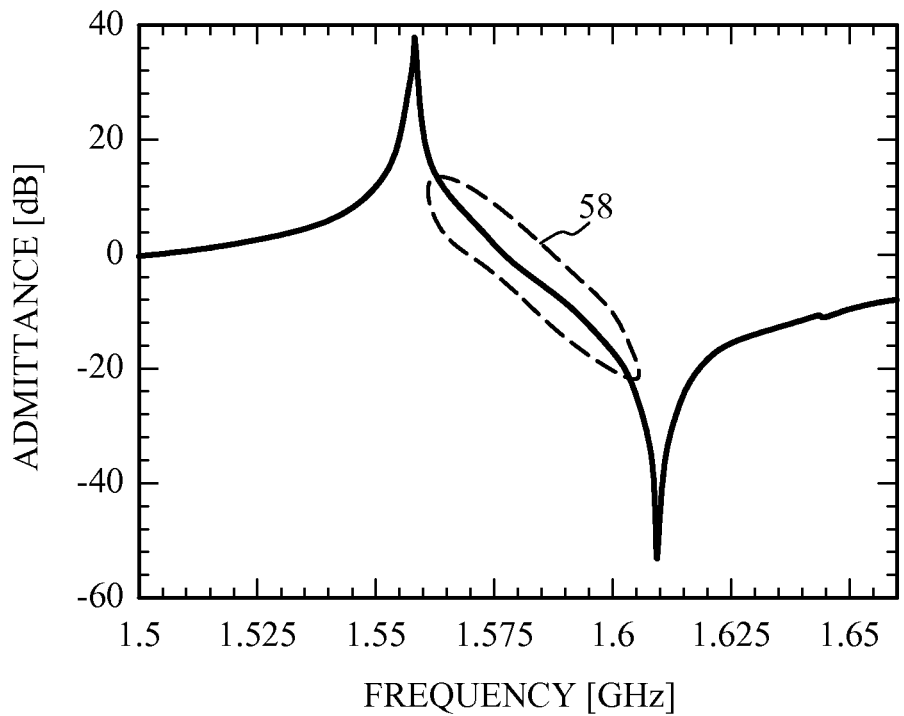

FIG. 9A and FIG. 9B are diagrams illustrating admittance with respect to a frequency in the second comparative example and the third embodiment respectively. As illustrated in FIG. 9A, when the piezoelectric film 14 is made of ZnO, spurious is generated in a region 58 between the resonance frequency and the anti-resonance frequency. As illustrated in FIG. 9B, the provision of the load film 28 enables to prevent spurious in the region 58.

According to the first through third embodiments, the patterns 52 are formed so as to surround the center 60 and intersect with the pathway 64 (e.g. linear pathway) extending from the center 60 to the outer periphery 62 of the resonance region 50 as illustrated in FIG. 3A and FIG. 3B. This enables to prevents the acoustic wave from propagating through the resonance region 50 in the lateral direction. Thus, spurious is prevented.

In addition, when each of the patterns 52 is formed so that a part of it surrounds the center 60 of the resonance region 50, the propagation of the acoustic wave in the lateral direction can be prevented, and spurious can be therefore prevented. For example, each of the patterns 52 preferably surrounds more than or equal to 50% of the center of the resonance region 50, and more preferably surrounds more than or equal to 75%. To further prevent spurious, the patterns 52 are preferably closed lines surrounding the center 60 of the resonance region 50 as illustrated in FIG. 5A and FIG. 5B. For example, each of the patterns 52 preferably surrounds 100% of the center 60 of the resonance region 50. The center 60 of the resonance region 50 may be a geometric center of the resonance region 50, but may be displaced from the geometric center.

Furthermore, the patterns 52 preferably have an approximately homothetic shape to the outer periphery of the resonance region 50. This allows the patterns 52 to be uniformly located from the center 60 to the outer periphery 62 of the resonance region 50. Thus, spurious can be further prevented.

Furthermore, the patterns 52 are preferably regularly formed to intersect with the pathway 64 extending from the center 60 to the outer periphery 62 of the resonance region 50. This allows the patterns 52 to be uniformly located from the center 60 to the outer periphery 62 of the resonance region 50. Thus, spurious can be further prevented.

Figure 10A:
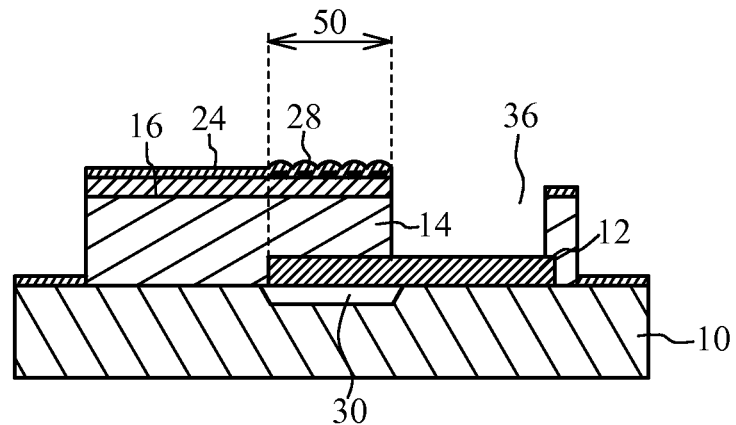
FIG. 10A is a cross-sectional view of a piezoelectric thin film resonator in accordance with a fourth embodiment.

Furthermore, the resonance region 50 preferably has a point-symmetric shape. This enables to further prevent spurious. The resonance region 50 does not have to have a point-symmetric shape, and may have a polygonal shape such as a pentagon, or a circular shape. Fourth Embodiment A fourth embodiment changes a structure of the air-space. FIG. 10A is a cross-sectional view of a piezoelectric thin film resonator in accordance with the fourth embodiment. As illustrated in FIG. 10A, a recess portion is formed in the upper surface of the substrate 10. The lower electrode 12 is formed on the substrate 10 so as to be approximately flat. This forms the air-space 30 in the recess portion of the substrate 10. The air-space 30 is formed in the resonance region 50. Other structures are the same as those of the first embodiment, and thus the description thereof is omitted. The air-space 30 may be formed so as to pierce through the substrate 10.

Figure 10B:
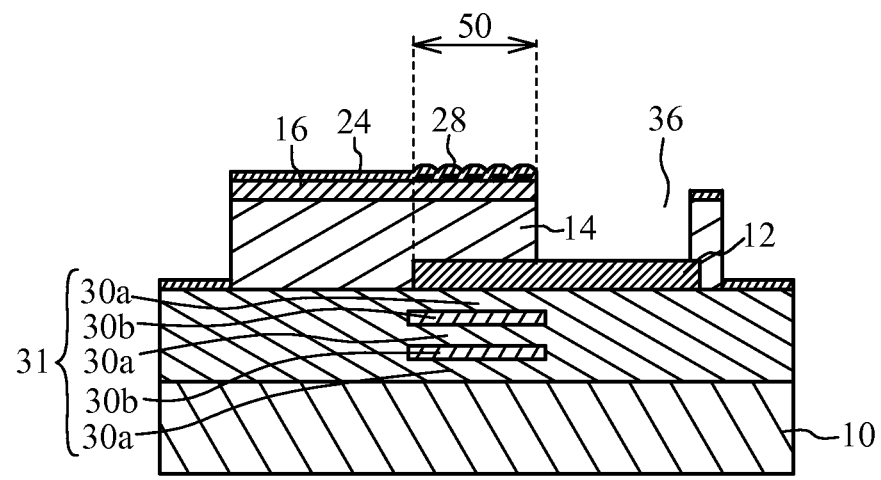
FIG. 10B is a cross-sectional view of a piezoelectric thin film resonator in accordance with a variation of the fourth embodiment.

A variation of the fourth embodiment provides an acoustic reflection film instead of the air-space. FIG. 10B is a cross-sectional view of a piezoelectric thin film resonator in accordance with the variation of the fourth embodiment. As illustrated in FIG. 10B, an acoustic reflection film 31 is formed under the lower electrode 12 in the resonance region 50. The acoustic reflection film 31 is formed by alternately stacking a film 30a with a low acoustic impedance and a film 30b with a high acoustic impedance. The films 30a and 30b have film thicknesses of, for example, approximately λ/4 (λ is the wavelength of the acoustic wave). The stacking number of the film 30a and the film 30b can be determined arbitrarily. Other structures are the same as those of the first through third embodiments, and thus the description thereof is omitted.

As described in the first through fourth embodiments, the piezoelectric thin film resonator may be an FBAR (Film Bulk Acoustic Resonator) in which the air-space 30 is formed between the substrate 10 and the lower electrode 12 in the resonance region 50. In addition, as described in the variation of the fourth embodiment, the piezoelectric thin film resonator may be an SMR (Solidly Mounted Resonator) in which the acoustic reflection film 31 that reflects the acoustic wave propagating through the piezoelectric film 14 is located under the lower electrode 12 in the resonance region 50.

In the ladder-type filter 100 illustrated in FIG. 1, the resonance frequency of the series resonator S is the high frequency end of the passband, and the anti-resonance frequency of the parallel resonator P is the low frequency end of the passband. Thus, when the piezoelectric film 14 is made of AlN, a ripple is formed in the passband when the spurious is generated at frequencies lower than the resonance frequency in the series resonator S. On the other hand, a ripple is not formed in the passband even though spurious is generated at frequencies lower than the resonance frequency in the parallel resonator P. Therefore, at least one of the series resonators S is preferably the piezoelectric thin film resonator of the first or second embodiment. More preferably, all the series resonators S are any one of the piezoelectric thin film resonators of the first, second, and fourth embodiment, and the variation of the fourth embodiment. The parallel resonator P may be any one of the piezoelectric thin film resonators of the first, second, and fourth embodiment, and the variation of the fourth embodiment.

On the other hand, when the piezoelectric film 14 is made of ZnO, spurious is generated in the region between the resonance frequency and the anti-resonance frequency. In this case, both spurious in the series resonator S and spurious in the parallel resonator P are generated in the passband. Thus, all the resonators in both the series resonator S and the parallel resonator P are preferably configured to be any one of the piezoelectric thin film resonators of the third and fourth embodiments and the variation of the fourth embodiment. This enables to further prevent ripples in the passband. In addition, at least one of the series resonator S and the parallel resonator P may be configured to be any one of the piezoelectric thin film resonators of the third and fourth embodiments and the variation of the fourth embodiment.

Furthermore, the piezoelectric thin film resonators of the first through fourth embodiments and the variation of the fourth embodiment may be used for a filter other than the ladder-type filter.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
   a substrate;
   a piezoelectric film located on the substrate;
   a lower electrode and an upper electrode located to sandwich the piezoelectric film;
   a load film formed of a plurality of separate patterns in a resonance region in which the lower electrode and the upper electrode face each other across the piezoelectric film, the resonance region being defined by a region in a plan view where all of the lower electrode, the upper electrode, and the piezoelectric film overlap with each other,
   wherein each of the plurality of separate patterns is formed so as to surround a center of the resonance region, and each of the plurality of separate patterns is disposed to intersect with a same virtual straight line extending from the center of the resonance region to an outside of the resonance region.

2. The piezoelectric thin film resonator according to claim 1, wherein
   each of the plurality of separate patterns is a closed round or rectangular loop surrounding the center.

3. The piezoelectric thin film resonator according to claim 2, wherein
   each of the plurality of separate patterns has an approximately homothetic shape to an outer shape of the resonance region.

4. The piezoelectric thin film resonator according claim 1, wherein
   the plurality of separate patterns intersect with the same virtual straight line at fixed intervals.

5. The piezoelectric thin film resonator according to claim 1, wherein
   the resonance region is symmetric with respect to the center.

6. The piezoelectric thin film resonator according to claim 1, wherein
   the load film is formed on the upper electrode.

7. The piezoelectric thin film resonator according to claim 1, wherein
   an air-space is formed between the substrate and the lower electrode in the resonance region.

8. The piezoelectric thin film resonator according to claim 1, further comprising:
   an acoustic reflection film that reflects an acoustic wave propagating through the piezoelectric film under the lower electrode in the resonance region.

9. A filter comprising:
   the piezoelectric thin film resonator according to claim 1.

10. The filter according to claim 9, further comprising:
    one or more series resonators and one or more parallel resonators,
    wherein at least one of the series resonators is the piezoelectric thin film resonator.

* * * * *